US007691443B2

(12) United States Patent
Rudolph et al.

(10) Patent No.: US 7,691,443 B2
(45) Date of Patent: Apr. 6, 2010

(54) NON-PRESSURE GRADIENT SINGLE CYCLE CVI/CVD APPARATUS AND METHOD

(75) Inventors: James W. Rudolph, Colorado Springs, CO (US); Vincent Fry, Santa Fe Springs, CA (US)

(73) Assignee: Goodrich Corporation, Charlotte, NC (US)

( * ) Notice: Subject to any disclaimer, the term of this patent is extended or adjusted under 35 U.S.C. 154(b) by 208 days.

(21) Appl. No.: 11/141,499

(22) Filed: May 31, 2005

(65) Prior Publication Data

US 2006/0269665 A1 Nov. 30, 2006

(51) Int. Cl.
*C23C 16/00* (2006.01)

(52) U.S. Cl. .................................................. 427/249.2

(58) Field of Classification Search ............... 427/249.2
See application file for complete search history.

(56) References Cited

U.S. PATENT DOCUMENTS

| | | | | |
|---|---|---|---|---|
| 4,134,360 | A | 1/1979 | Fisher et al. | |
| 4,212,906 | A | 7/1980 | Fisher et al. | |
| 4,291,794 | A | 9/1981 | Bauer | |
| 4,580,524 | A | 4/1986 | Lackey, Jr. et al. | |
| 4,790,052 | A | 12/1988 | Olry | |
| 4,895,108 | A | 1/1990 | Caputo et al. | |
| 5,348,774 | A | 9/1994 | Golecki et al. | |
| 5,480,678 | A | 1/1996 | Rudolph et al. | |
| 5,853,485 | A | 12/1998 | Rudolph et al. | |
| 5,904,957 | A | 5/1999 | Christin et al. | |
| 6,001,419 | A * | 12/1999 | Leluan et al. | 427/249.2 |
| 6,132,877 | A | 10/2000 | Winckler et al. | |
| 6,572,371 | B1 | 6/2003 | Sion et al. | |
| 6,669,988 | B2 * | 12/2003 | Daws et al. | 427/249.2 |
| 2001/0019752 | A1 * | 9/2001 | Purdy et al. | 428/64.1 |
| 2003/0035893 | A1 | 2/2003 | Daws et al. | |
| 2005/0178327 | A1 * | 8/2005 | Rudolph et al. | 118/715 |
| 2006/0263525 | A1 * | 11/2006 | Sion et al. | 427/249.2 |

FOREIGN PATENT DOCUMENTS

| | | |
|---|---|---|
| EP | 0 846 787 A1 | 6/1998 |
| EP | 0 995 815 A1 | 4/2000 |
| EP | 1 285 976 A2 | 2/2003 |
| JP | 01197748 | 3/1991 |
| WO | WO 96/15285 | 5/1996 |
| WO | WO 2004/097065 | * 11/2004 |

OTHER PUBLICATIONS

W.V. Kotlensky, "Deposition of Pyrolytic Carbon in Porous Solids," 9 Chemistry and Physics of Carbon, p. 173, pp. 190-203, (1973).

(Continued)

*Primary Examiner*—Timothy H Meeks
*Assistant Examiner*—Elizabeth Burkhart
(74) *Attorney, Agent, or Firm*—Snell & Wilmer L.L.P.

(57) ABSTRACT

A method for densifying porous structures inside a furnace using non-pressure gradient CVI/CVD in a single cycle is described. A hardware assembly for use in the single cycle non-pressure gradient CVI/CVD process is provided as well are process and process conditions are described.

20 Claims, 4 Drawing Sheets

OTHER PUBLICATIONS

S. Kamura, N. Takase, S. Kasuya, and E. Yasuda, "Fracture Behaviour of C Fiber / CVD C Composite," Carbon '80 (German Ceramic Society), (1980).
A.J. Caputo and W.J. Lackey, "Fabrication of Fiber-Reinforced Ceramic Composites by Chemical Vapor Infiltration," prepared by Oak Ridge National Laboratory for the U.S. Department of Energy under Contract No. DE-AD05-840R21400, (1984).
W.J. Lackey, "Review, Status, and Future of the Chemical Vapor Infiltration Process for Fabrication of Fiber-Reinforced Ceramic Composites," Ceram. Eng. Sci. Proc. 10[7-8] p. 577, pp. 577-581, (1989).
T.M. Besmann, R.A. Lowden, D.P. Stinton, and T.L. Starr, "A Method for Rapid Chemical Vapor Infiltration of Ceramic Composites," Journal de Physique, Colloque C5, supplement au n°5, Tome 50, (1989).
T.D. Gulden, J.L. Kaae, K.P. Norton, "Forced-Flow Thermal-Gradient Chemical Vapor Infiltration (CVI) of Ceramic Matrix Composites," Proc. -Electrochemical Society (1990), 90-12 (Proc. Int. Conf. Chem. Vap. Deposition, $11^{th}$, (1990) pp. 546-552.
T. Hunh, C.V. Burkland, and B. Bustamante, "Densification of a Thick Disk Preform with Silicon Carbide Matrix by a CVI Process," Ceram. Eng. Sci. Proc. 12[9-10] pp. 2005-2014, (1991).

* cited by examiner

NON-PRESSURE GRADIENT SINGLE CYCLE CVI/CVD APPARATUS AND METHOD

FIELD OF THE INVENTION

The present invention relates to the field of chemical vapor infiltration and deposition processes of a binding matrix within a porous structure. More particularly, the invention relates to non-pressure gradient single cycle processes for enhancing infiltration of a reactant gas into a porous structure, apparatus for carrying out such processes, and the resulting composite products.

BACKGROUND OF THE INVENTION

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components.

Generally, manufacturing carbon parts using a CVI/CVD process involves placing preformed porous structures in a furnace and introducing a high temperature reactant gas to the porous structures. A variety of porous structures and reactant gases may be used, but typically, a fibrous carbon porous structure is used with a reactant gas mixture of natural gas and/or propane gas when carbon/carbon aircraft brake disks are manufactured. As well understood by those in the art, when the hydrocarbon gas mixture flows around and through the porous structures, some of the carbon atoms separate from the hydrocarbon molecules, thereby depositing the carbon atoms within the interior and onto the surface of the porous structures. As a result, the porous structures become more dense over time as more and more of the carbon atoms are deposited onto the structures. This process is sometimes referred to as densification because the open spaces in the porous structures are eventually filled with a carbon matrix until generally solid carbon parts are formed. U.S. Pat. Nos. 5,480,578 and 5,853,485 to Rudolph et al. and U.S. Pat. No. 6,669,988 to Daws et al., hereby incorporated by reference, also describe in detail additional aspects of CVI/CVD processes.

Densification processes for annular brake disks may be characterized as either conventional densification processes or rapid densification processes or variants thereof. In conventional densification, annular brake disks are arranged in stacks with adjacent brake disks stacked on top of each other. A center opening region is thus formed through the center of each stack. Typically, spacers are placed between adjacent brake disks to form open passages between the center opening region and the outer region. Thus, the reactant gas flows randomly around the stack and may flow through the open passages from the center opening region to the outer region or vice versa. As a result, the pressure differential between the inlet and outlet ducts of the furnace is usually relatively low in conventional processes. On the other hand, in rapid densification, the open passages between the center opening region and the outer region are sealed to constrict the flow of the reactant gas between the center opening region and the outer region. Therefore, the pressure differential between the inlet and outlet ducts of the furnace is higher than the pressure used in conventional densification. As a result, the high pressure differential forces the reactant gas to flow through the interior of the porous brake disk structures, thereby increasing the rate of densification compared to conventional processes. Conventional and rapid densification processes may also be combined to achieve optimum densification. For example, a rapid densification process may be used in a first densification to decrease densification time, and a conventional densification may be used in a second densification to improve densification quality.

One area of concern during densification is the distribution of the reactant gas flow through and around the porous structures. Gas flow distribution can have a significant impact on the quality of the densified carbon parts and also can affect the cost of production. For example, in one method disclosed in U.S. Pat. No. 5,904,957 to Christin et al., stacks of annular preforms are placed in a furnace with spacer elements placed between each of the preforms and between the last performs in the stacks and the screens at the top end. Thus, leakage passages are formed between adjacent preforms. The gas is then exclusively channeled towards only the interior passage of each annular stack at the bottom end. The top end of the stacks are closed by solid screens. One disadvantage with this method is that the outer surfaces of the brake disks near the bottom of the stacks may become starved for gas, thereby producing an undesirable densification of the bottom brake disks and nonuniformity in densification between the bottom and top brake disks. Another disadvantage is that the closed top end of the stacks blocks the gas flow out of the top end, thus causing gas stagnation problems.

Another problem that often occurs during densification is soot and thick coatings on surfaces of the brake disks and tar on the furnace equipment. As is known to those in the art, soot usually refers to undesirable accumulations of carbon particles on the furnace equipment, while tar usually refers to undesirable accumulations of large hydrocarbon molecules on the furnace equipment. The large hydrocarbon molecules cause thick coatings on the surfaces of the brake disks. Typically, accumulations of soot and tar form when the reactant gas stagnates for a period of time in an area or comes into contact with cooler furnace surfaces. Stagnation typically occurs in areas where the gas flow is blocked or where the gas flow is moving more slowly than the surrounding gas flow.

Accumulations of soot and tar can cause a number of problems which affect both the quality of the carbon parts and the costs of manufacturing. Seal-coating is one typical problem that can result from soot and tar, although seal-coating can also be caused by other conditions that are described below. Seal-coating can occur when soot and large hydrocarbon molecules deposit excess carbon early in the densification process on surfaces of the porous structure. As the carbon accumulates on the surfaces of the porous structure, the surface pores eventually become blocked, or sealed, thus preventing the flow of reactant gas from further permeating the porous structure. As a result, densification of the interior region around the seal-coated surface prematurely stops, thereby leaving interior porous defects in the finished carbon part.

Maintenance costs also increase due to soot and tar accumulations on the furnace equipment. During the densification process, accumulations of soot and tar often form throughout the furnace equipment. As a result, an extensive manual cleaning process may be periodically required after each production run to remove all the accumulations and prepare the furnace for the next production run. This cleaning job can be very time consuming and can result in significant delays between production runs. The accumulations can also make disassembly of close fitting parts especially difficult since the accumulations tend to bind the parts tightly together. As a result, furnace equipment sometimes becomes damaged during disassembly due to the difficulty of separating the parts. Additionally, the furnace vacuum lines sometimes become constricted by soot and tar. As those in the art are familiar, the vacuum lines are used to generate the desired gas flow through the furnace. However, soot and tar accumulations sometimes build up in these lines and reduce the performance of the vacuum. Therefore, the vacuum lines must be regularly cleaned, which is a time consuming and expensive task.

In order to produce high quality, low cost parts, carbon deposition should be as uniform as possible around and through the porous structures. One way to achieve this desired uniformity is to optimize the residence time of the gas in the furnace. Residence time typically refers to the amount of time required for a gas to travel through the furnace or other designated area. Typically, a low residence time is associated with an unobstructed flow path and is generally preferred.

Gas flow obstructions often cause additional problems during densification. As previously mentioned, seal-coating is a common problem that causes porous defects within the interior region of the completed carbon parts. However, in addition to the causes previously described, seal-coating also can occur due to nonuniform carbon deposition. This typically occurs when a nonuniform gas flow accelerates carbon deposition at the surface of a part, thereby sealing the surface with carbon deposits and blocking gas diffusion into the interior of the carbon structure. Usually this type of seal-coating occurs later in the densification process when the density of the porous structures are higher.

Another problem associated with nonuniform carbon deposition is the formation of undesirable carbon microstructures. For example, in the case of high performance carbon/carbon brake disks, a rough laminar carbon microstructure is preferred because of the friction and thermal characteristics of this microstructure. However, when the residence time of the gas flow is prolonged or the gas flow stagnates in obstructed areas, smooth laminar and dark laminar carbon microstructures may form instead. As known by those in the art, smooth and dark laminar microstructures are generally undesirable because brake disk performance is reduced unless the outer surfaces containing the undesirable microstructures are machined off in subsequent operations.

Thus, previous processes, both conventional and rapid densification processes, required multiple densification steps, with the porous structures requiring rearrangement and machining between steps in order to achieve acceptable densification results in the final product. The rearrangement and machining of the porous structure between cycles is costly and time-consuming. Thus, in spite of these advances, a non-pressure gradient CVI/CVD process and an apparatus for implementing that process are desired that quickly and uniformly densifies porous structures while minimizing cost and complexity. Such a non-pressure gradient process would preferably be capable of simultaneously densifying large numbers (as many as hundreds) of individual porous structures in a single step. In particular, a non-pressure gradient process is desired for quickly and economically densifying large numbers of annular fibrous preform structures for aircraft brake disks having desirable physical properties in a single cycle is preferred.

SUMMARY OF INVENTION

The present invention is directed to a process for non-pressure gradient CVI/CVD densifying porous structures in one cycle inside a furnace. The process includes providing a furnace, the furnace defining an outer volume, and assembling a multitude of porous structures with a central aperture and spacers between adjacent pairs of porous structures arranged in a stack. The process also includes disposing the stack of porous structures between a bottom plate and a top plate with spacers between each porous structure. The process also includes providing the introduction of a gas to the stack. The process parameters are monitored and adjusted so that porous structures are densified using a non-pressure gradient CVI/CVD process in one cycle to the desired density.

The present invention allows non-pressure gradient CVI/CVD densification of porous structures in a single cycle. This has the benefit of an increase in efficiency from the elimination of the numerous non-value added steps, such as production queue times, furnace loading and unloading, and furnace heat-up and cool-down. In-process machining is not needed and thus is reduced in the single cycle process.

The present invention is directed to an apparatus for densifying porous structures inside a furnace using a non-pressure gradient CVI/CVD to achieve densification of the porous material in a single cycle. The apparatus includes a stack of porous structures where each porous structure has a central aperture therethrough. The apparatus also includes at least one spacer disposed within the stack of porous structures between neighboring porous structures. An outer region is formed between the stack and the inside of the furnace. In one embodiment, a distributor is provided which separates the gas into a first and second portion. A first portion of gas is introduced into the central aperture of the stack and passes to a center opening region formed by the stack of annular porous structures. In another embodiment, the first portion of the gas passes to the center opening region without the use of a distributor. In yet another embodiment, the gas is channeled to only the center opening region.

The foregoing paragraphs have been provided by way of general introduction, and are not intended to limit the scope of the following claims. The presently preferred embodiments, together with further advantages, will be best understood by reference to the following detailed description taken in conjunction with the accompanying drawings.

DESCRIPTION OF THE PREFERRED EMBODIMENT

The invention and various embodiments thereof are presented in FIGS. 1 through 4 and the accompanying descriptions wherein like numbered items are identical. The term "single cycle" refers to a process that is capable of densifying preforms from a starting density to a desired product density in a non-pressure gradient CVI/CVD process cycle, without the need for either machining or rearranging the performs.

Figure 1:
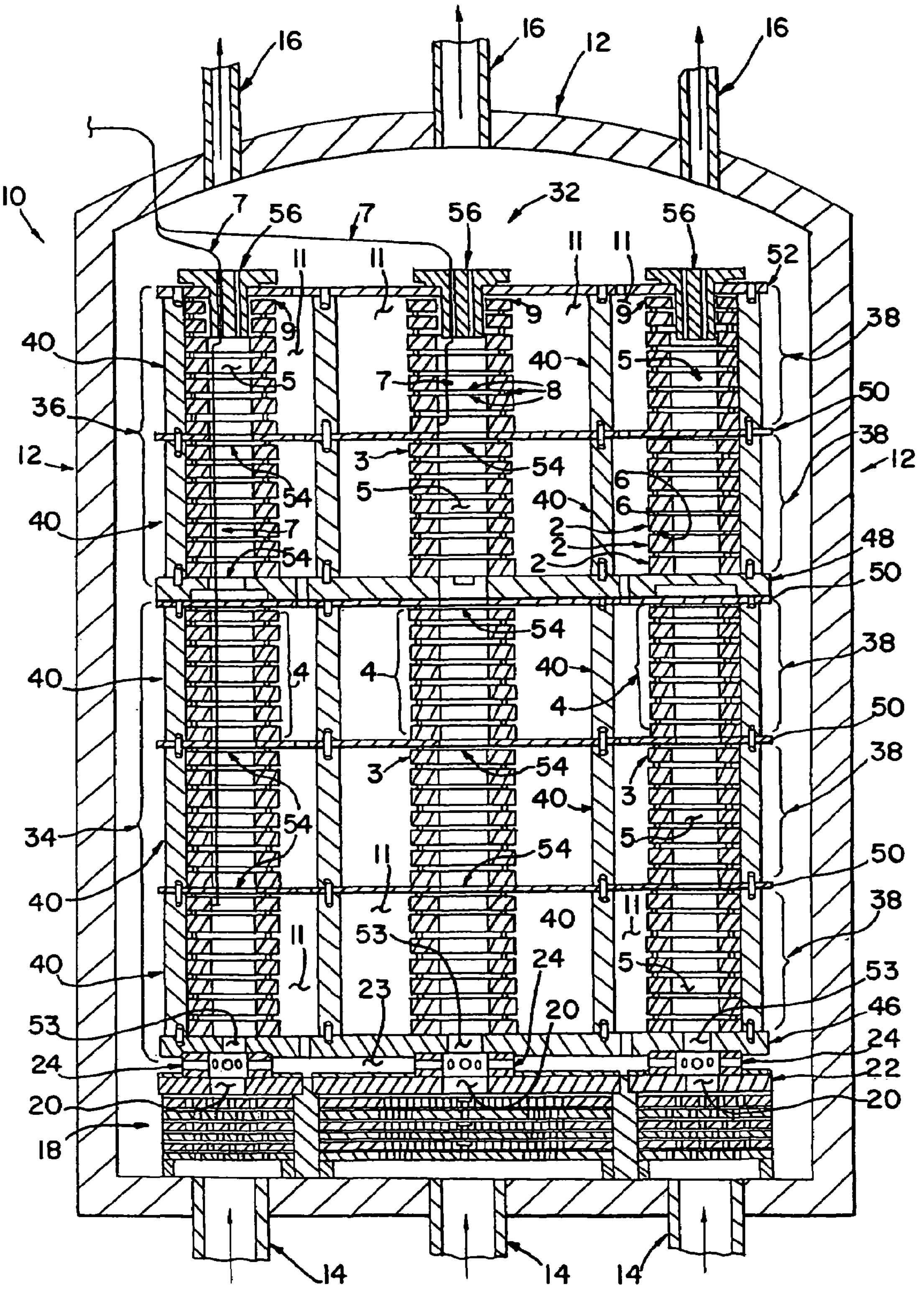
FIG. 1 shows a side cross sectional view of a CVI/CVD furnace.
Figure 2:
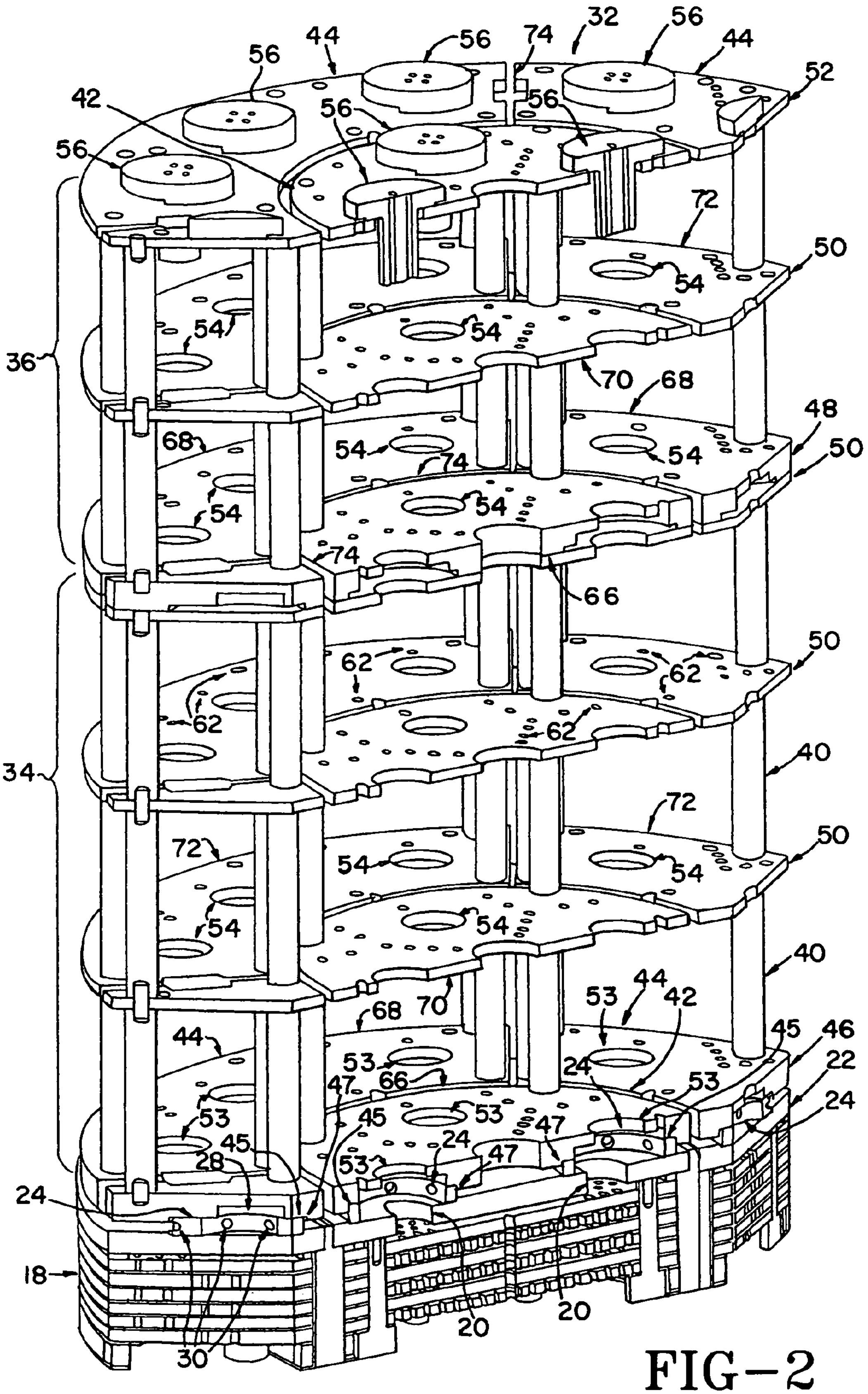
FIG. 2 shows a perspective view of the furnace, showing the top of the furnace open and a portion of the furnace wall broken away to show the hardware assembly.

Referring now to FIGS. 1 and 2, a schematic depiction is presented of a CVI/CVD furnace adapted to deposit a matrix within a porous structure by a non-pressure gradient CVI/CVD process according to an aspect of the invention.

A number of different types of furnaces 10 may be used for CVI/CVD processes. Commonly, an induction furnace 10 is used that includes furnace walls 12 that enclose the hardware assembly 32 and the stacks 4 of porous structures 2. A susceptor is disposed around the reactor volume (not shown) and is induction heated by an induction coil according to methods well known in the art. Although induction heating is described herein, other methods of heating may also be used such as resistance heating and microwave heating, any of which are considered to fall within the purview of the invention. The furnace 10 also includes inlet ducts 14 and outlet ducts 16 for introducing and exhausting the gas mixture into and out of the furnace 10.

A preheater 18 is also commonly provided within the furnace 10 to heat the gas before the gas is directed to the porous structures 2. Typically, the preheater 18 is sealed and the incoming gas from the inlet ducts 14 is received by the preheater 18 before being introduced to the hardware assembly 32. The preheated gas is then discharged from the preheater 18 through discharge openings 20 in the furnace floor plate 22 of the preheater 18.

In one embodiment, at least one distributor 24 is provided at the preheater discharge openings 20 for controlling the flow of gas around the stacks 4 of porous structures 2. Preferably, the distributors 24 are removably mounted between the floor plate 22 of the preheater 18 and the base plate 46 of the bottom hardware assembly modules 34. To aid installation of the distributors 24, recessed areas 45 with guide diameters 47 are provided in both the top surface of the floor plate 22 and the bottom surface of the hardware assembly base plate 46. The recessed areas in the floor plate 22 are generally concentric with each of the discharge openings 20, and the recessed areas 45 in the hardware assembly base plate 46 are generally concentric with each of the inlet openings 53. Therefore, the distributors 24 may be easily installed by inserting the outer diameter of each distributor into one of the guide diameters in the floor plate 22 and one of the guide diameters 47 in the base plate 46.

The distributor 24 directs the gas from the preheater 18 into at least two different portions and directs the portions in different directions. Accordingly, the distributor 24 includes an axial hole 28 that extends longitudinally through the distributor 24. Thus, a first portion of gas flows through the axial hole 28 from the preheater discharge opening 20 to the hardware assembly inlet opening 53. The distributor 24 also includes a number of radial holes 30 that extend out from the axial hole 28 to the outer diameter of the distributor 24. Thus, a second portion of gas flows out of the distributor 24 through the radial holes 30 to the space between the floor plate 22 and the bottom base plate 46. Other equivalent passageways, such as grooves or the like, formed into the floor plate 22, the bottom base plate 46, the distributor 24, or other hardware member may also be used in place of the radial holes 30.

In one exemplary embodiment, the first portion that flows through the inlet opening 53 of the bottom base plate 46 represents about 76% of the gas mixture, and the second portion that flows out through the radial holes 30 represents about 24% of the gas mixture. In this embodiment, the first gas flow portion is restricted by the inlet opening 53, which is about 5 inches in diameter, in the bottom base plate 46. The second gas flow portion is then restricted by the radial holes 30, which consist of eight holes about 1 inch in diameter. Other proportions for the first portion and second portion may also be advantageous, and other sizes and placement of the inlet opening 53, axial hole 28 and radial holes 30 may be used. For example, the range of flow through the inlet opening may be as low as 15% to as much as 85%, while the range of flow into the space between the floor plate 22 and the bottom base plate 46 may be as high as 85% to as low as 15%. Typically, the preferred embodiment uses a proportion of about 80% for the first portion and about 20% for the second portion, but proportions between 60% and 90% for the first portion and 40% to 10% for the second portion, or vice versa, may be used.

Alternatively, all the gas from the preheater can be directed to the hardware assembly inlet opening 53. The gas can all flow through the preheater discharge opening 20 which can be aligned with the hardware assembly opening 53 so that the gas is exclusively channeled towards only the interior of the stack of porous structures. A distributor or other apparatus can be used in the preheater discharge opening to ensure that the gas is directed to the hardware assembly inlet opening in the desired manner and distributed to both the interior and exterior of the stack. Furthermore, different configurations of equipment are possible wherein the gas is distributed to the interior and exterior of the stack of the porous structures. For example, spacers of varying heights can be used between the bottom plate and the bottom porous structure to create the channels.

Inside the furnace, a hardware assembly can be found. A typical hardware assembly 32 preferably consists of a number of separate modules 34, 36 to make assembly, disassembly, loading and unloading of the hardware assembly 32 easier. Accordingly, as shown in FIG. 1, the hardware assembly 32 includes a bottom set of modules 34 with three units 38. A unit 38 usually refers to the area between an adjacent base plate 46, 48 and a support plate 50 or between adjacent support plates 50, 52 where one level of porous structure 4 is supported. Support posts 40 separate the base plates 46, 48 and support plates 50, 52, thereby forming each unit 38. The hardware assembly 32 also includes a top set of modules 36 similar to the bottom set 34 with two units 38. As shown in FIG. 2, the top and bottom sets of modules 34, 36 also include a center module 42 with typically four stacks 4 of porous structure 2 and a number of arc-shaped outer modules 44 with two or more stacks 4 of porous structure 2 each, however, different configurations may be used. Accordingly, each of the modules 34, 36, 42, 44 may be loaded into the furnace 10 one at a time, leaving approximately I inch gaps 74 between the outer modules 44 and between the outer modules 44 and the center modules 42. Typically, the base plates 46, 48 and support plates 50, 52 are usually referred to as single base plates 46, 48 and single support plates 50, 52 for simplicity even though the base plates 46, 48 include separate center plates 66 and outer plates 68 and the support plates 50, 52 include similar separate center plates 70 and outer plates 72. Preferably, each of the components of the hardware assembly 32 and the distributor 24 are made from a graphite (e.g., HTM or HLM graphite) material that is compatible with typical CVI/CVD processes used for manufacturing carbon/carbon brake disks 2. Alternatively, the components of the hardware assembly 32 and distributor can be made from any material that can withstand the conditions in the furnace. An example of such a material is carbon-carbon material.

Figure 3:
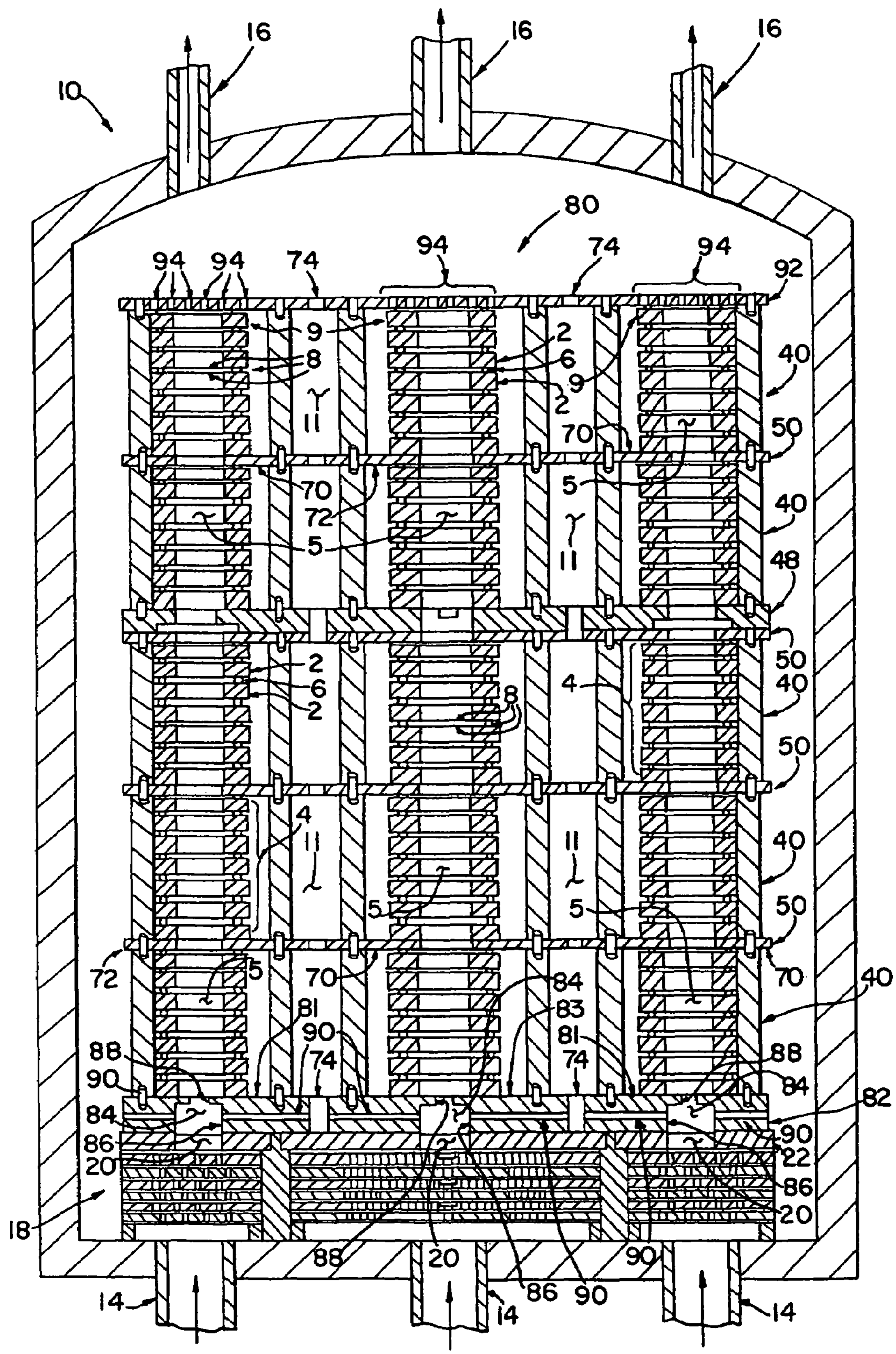
FIG. 3 shows a side cross sectional view of a furnace showing an alternate hardware assembly.

The porous structures 2 are loaded into the hardware assembly 32 in stacks 4, with each porous structure 2 being separated from adjacent porous structure 2 with spacers 6 about 0.125 to 1.0 inch thick as shown in FIG. 3. A sufficient quantity of spacers are used to separate the adjacent porous structures and prevent warpage of the structures. Therefore, open passages 8 are formed between adjacent porous structures 2. Similarly, the top porous structure 3, 9 in each unit 38 is spaced about 0.125 to 1.0 inch from the bottom surface of the adjacent support plate 50, 52 to form another open passage 8. Preferably, the spacing between the porous structures is uniform. Further, preferably, the spacing between the porous structures and the bottom and top of support plate 50, as well as top support plate 52 and bottom base plate 46 is uniform. This can be achieved, for example, by placing slotted seal rings between the uppermost porous structure and the adjacent support plate 50. Other arrangements for achieving uniform spacing as well as uniform gas flow can be used and are well within the purview of one of ordinary skill in the art. The stacks 4 of porous structures 2 are also positioned within the hardware assembly 32 with the center openings 5 of the annular porous structures 2 coaxial with the inlet openings 53 in the bottom base plate 46 and with the transfer openings 54 in the support plates 50 and top base plate 48.

Caps 56 are installed into the transfer openings 54 of the top support plate 52 of the top module 36 in order to restrict gas flow through the top of the stacks 4. Each of the caps 56 include an extended portion that extends down into the center openings 5 of the top porous structure 9. Four longitudinal holes are also provided through the caps 56 to allow some gas flow to escape upward from the center openings 5 of the stacks 4. Thermocouple wires 7 may also be routed through the holes in the caps 56 and down through the center openings 5 in the stacks 4. The thermocouple wires 7 are then connected to thermocouples embedded in sample brake disks (not indicated) at various heights in the stacks 4 to measure the representative temperature of the porous structure 2.

The gas flow through the hardware assembly 32 is more uniform and beneficial compared to other densification processes. Thus, higher quality parts (i.e., with a more uniform and more desirable microstructure) may be produced with lower manufacturing costs. Accordingly, a gas is supplied to the inlet ducts 14, while a vacuum is produced at the outlet ducts 16. The gas is then drawn through the preheater 18, thereby raising the temperature of the gas. Next, the gas exits the preheater 18 through the discharge openings 20 in the floor plate 22, thereby passing into the axial hole 28 of each of the distributors 24 if the embodiment with the distributors is used. The gas is then separated into a first portion of about 76% of the gas and a second portion of about 24% of the gas. The first portion passes through the axial hole 28 in the distributor 24 and through the inlet opening 53 in the hardware assembly base plate 46. The second portion passes out through the radial holes 30.

The first portion of gas passes up through the center opening region 5 in the stacks 4 of annular porous structures 2. The gas passes to adjacent stacks 4 in the adjacent units 38 through the transfer openings 54 in the support plates 50 and the top base plate 48. The gas also passes out from the center opening region 5 through the open passages 8 between the adjacent porous structure 2. A controlled pressure is maintained in the center opening region 5 by the caps 56 which block and restrict the gas from completely flowing out from the center opening 5 in the top porous structure 9 of the hardware assembly 32. However, some gas flow is permitted through the center opening 5 of the top porous structure 9 to avoid stagnation of the gas near the top of the stacks 4. Accordingly, some gas flows out through the longitudinal holes in each of the caps 56, and some gas flows out the open passage 8 between the top porous structure 9 and the top support plate 52.

The second portion of gas exits the radial holes 30 in the distributor 24 and passes to the open space 23 between the floor plate 22 and the hardware assembly base plate 46. The gas then passes up into the hardware assembly 32 through passage holes 62 in the center plate 66 and the outer plates 68 of the bottom base plate 46. The gas also passes up through the gaps 74 between the center plate 66 and the outer plates 68 and between each of the outer plates 68. Thus, the gas passes up along the outer region 11 around the outer surfaces of the stacks 4. The gas passes through the units 38 by passing through passage holes 62 and gaps 74 in the support plates 50 and the top base plate 48. As the second portion of gas passes up through the hardware assembly 32, it combines with the first portion of gas from the center opening region 5 as the gas passes out through the open passages 8. When the gas reaches the top of the hardware assembly 32, the gas passes out of the hardware assembly through passage holes 62 and gaps 74 in the top support plate 52. Both portions of gas then exit the furnace 10 through the outlet ducts 16. Thus, it is apparent that the hardware assembly 32 and distributor 24 minimize gas stagnation zones. Therefore, the related problems typically associated with gas stagnation zones are avoided, such as soot and tar accumulations, seal-coating, nonuniform carbon deposition and undesirable micro structures.

As shown in FIG. 3, the flow of gas through the hardware assembly 80 may also be controlled between a first portion and a second portion without using the distributors 24 and caps 56. In this alternative arrangement, the bottom base plate 82 rests directly on top of the furnace floor plate 22. The inlet openings 84 include a lower, larger diameter hole 86. The radial holes 90 extend through the base plate 82 from the lower, larger diameter holes 86 to the gaps 74 between the outer base plates 81, and between the outer base plates 81 and the center base plate 83, and to the outer edge of the outer base plates 81. Small holes 94 are also provided through the top support plate 92.

The gas flow through the alternative hardware assembly 80 is now apparent. Like the hardware assembly 32 previously described, the hot reactant gas enters through the inlet ducts 14 and passes through the preheater 18. The gas then exits the preheater 18 through the discharge openings 20 and passes directly into the lower, larger diameter hole 86 of the inlet opening 84. Next, a first portion of gas passes through the upper, smaller diameter hole 88 in the inlet opening 84. A second portion of gas also passes through the radial holes 90. Accordingly, as previously described with respect to the first hardware assembly 32, the first portion of gas then passes up through the center opening region 5, while the second portion of gas passes up along the outer region 11. As the first portion of gas passes up through the center opening region 5, most of the first portion passes out to the outer region 11 through the open passages 8 between adjacent brake disks 2 and commingles with the second portion. Some of the first portion, however, passes up through the entire center opening region 5 and exits the hardware assembly 80 through the small holes 94 in the top support plate 92. The remaining commingled gas then exits the hardware assembly 80 through the gaps 74 between the plates 70, 72 and along the outside of the hardware assembly 80.

Figure 4:
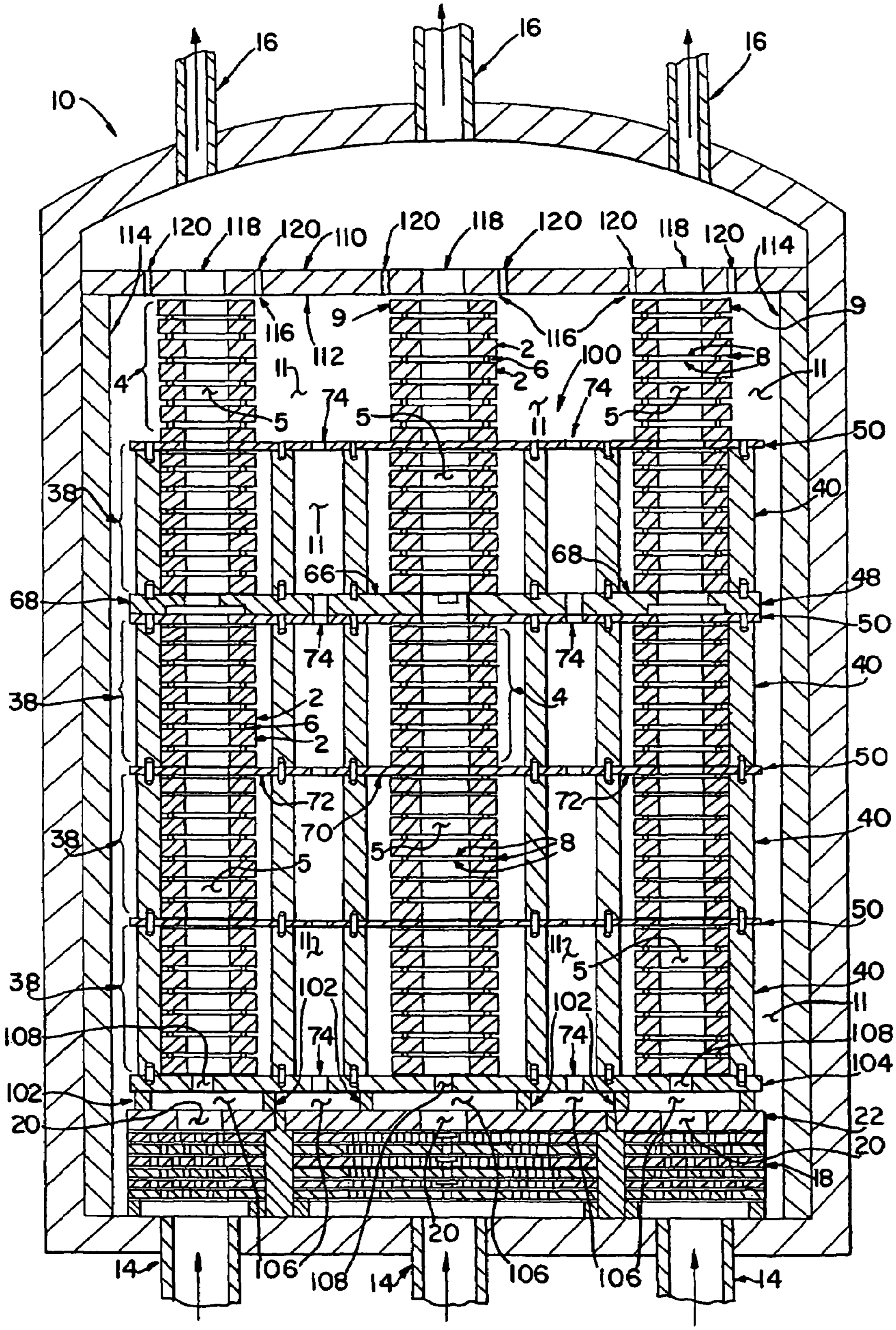
FIG. 4 shows a side cross sectional view of a furnace showing yet another alternate hardware assembly.

Turning now to FIG. 4, another alternative hardware assembly 100 is shown for flowing most of the gas from the outer region 11 to the center opening region 5. In this hardware assembly 100, spacers 102 are provided between the floor plate 22 and the bottom base plate 104. The spacers 102 may be round or square members and do not restrict gas flow through the space 106 between the floor plate 22 and the bottom base plate 104. The inlet openings 108 in the bottom base plate 104 are also smaller in size than the discharge openings 20 in the floor plate 22 to restrict flow through the inlet openings 108. The majority of the gas flows through the stack via opening 74.

If desired, the top unit 38, which is shown in the previous hardware assemblies 32, 80, may be removed in this alternative hardware assembly 100. The top stack 4 of porous structure 2 is then stacked so that the top porous structure 9 is spaced away from the bottom surface 112 of the susceptor lid 110 with an open passage 116 therebetween. Preferably, the open passage 116 is no more than 1 inch wide although larger widths may also be used. Spacer rings, well known to those in the art, may be used to achieve a desired width for the open passage 116. Exit holes 118 are provided through the susceptor lid 110, or comparable plate, directly above each of the stacks 4. Small holes 120 through the susceptor lid 110 may also be provided away from the exit holes 118. The susceptor lid 110 is supported by and sealed to the susceptor walls 114.

The various aspects of the present invention may be used to deposit any type of CVI/CVD matrix including, but not limited to, carbon or ceramic matrix deposited within carbon or ceramic based porous structures. The invention is particularly useful for depositing a carbon matrix within a carbon-based porous structure, and especially for making carbon/carbon composite structures which can be used in aircraft brake disks. The furnace may be suited for simultaneously densifying large quantities of porous articles, for example five hundred to one thousand annular preforms for manufacturing aircraft brake discs in a single cycle.

A unique feature of the present invention is that the process allows for products with a desirable densified structure produced in a single non-pressure gradient CVI/CVD process cycle. The reactant gas may be introduced into the reactor volume by a variety of methods, as described below. All of these methods of introducing reactant gas into the reactor volume, and variations thereof, are intended to be encompassed within the scope of the present invention.

One of the factors in achieving the desired properties for the porous structure 2 is to monitor and change the process parameters during the single run. A variety of different processing parameters may be used to densify the porous structure 2. Preferably, a vessel pressure in the range of about 5 to about 30 mm Hga ("mercury absolute") is used. Most preferably the vessel pressure is about 20 mm Hga. The temperature in the vessel or reactor is preferably in the range of about 1900 to 1830 degrees Fahrenheit; preferably in the range of about 1875 to about 1830 degrees Fahrenheit. A single type of gas or mixtures of multiple types of gases may be supplied to the gas inlet 62. The gas used for carbon CVI/CVD process is typically composed of hydrocarbons, such as those found in natural gas, such as for example, methane, ethane, propane, and butane. The gas may also be one of the several precursors used for ceramic CVI/CVD proces, such as methyltrichlorosilane. Preferably, the gas is a mixture in the range of about 80-99.9% natural gas and 20 to 0.1% propane. For brake disc applications, the gas is preferably on the average about 90% natural gas and about 10% propane. The gas is described as a mixture of natural gas and propane, one of ordinary skill in the art could use other gases and mixtures of gases to achieve the same results. Furthermore, if desired, the process parameters (temperature, pressure, gas mixture) can be decreased or adjusted during the run. Either one, two or all of these parameters can be adjusted or decreased as desired to obtain the desired density. Preferably, the values of these parameters are decreased during the run.

Generally using the apparatus and the single cycle process of the present invention, about 500 to about 700 hours on gas are used to achieve the desired densification in the single cycle. The details of the process of the present invention, where not described herein, are substantially similar to the non-pressure gradient CVI/CVD densifying porous structures as described in detail in U.S. Pat. No. 6,669,988.

Preferably, the temperature of the vessel and the percentage of the reactive gas in the gas mixture, as well as the pressure of the vessel, is lowered during the run to maintain the infiltration into the porous substrate and to keep the carbon microstructure in the rough laminar region as desired for brake discs. A plurality of control valves and flow meters is used to control the flow of reactant gas to the furnace. The reactant gas flows though one or more preheaters, which raise the temperature of the reactant gas. A susceptor, such as susceptor 114 in FIG. 4, heats the porous structures. Reactant gas is then supplied to the inner volumes of each fixture. A small amount of reactant gas is introduced into the outer volume 11 in FIG. 1. This reactant gas may be introduced into the outer volume through channels in the base plate, through the channels in pass-through spacer designs, through other means, or through some combination of the above. Temperature sensors measure the temperatures inside the porous structure apertures and the temperatures of the porous structures.

The porous structures may be subjected to heat treatment, if desired. The heat treatment may occur in the middle of the non-pressure gradient CVI/CVD process or after the non-pressure gradient CVI/CVD process is completed. The heat treatment step may also be skipped. The heat treatment process is conducted at a higher temperature than the previous deposition process temperatures, which increases graphitization of the first carbon matrix.

Following the non-pressure gradient CVI/CVD process, the porous structures are removed from the furnace and surface machined in order to derive an accurate bulk density measurement. The densified structures are machined into final parts. In the present invention, there is no need for multiple CVI/CVD densification steps or for intermediate machining or rearranging the structures during the CVI/CVD densification process. In a certain embodiment, the CVI/CVD process are conducted at about 1700°-2000° F., and heat treatment is conducted at about 3000°-4000° F.

In one embodiment, additional steps are taken in order to ensure maximum efficiency of the process. In one embodiment, spacers are either CVI/CVD coated or graphite paint coated to prevent hard bonding of spacer surfaces to the part surfaces. The porous structures are designed with dimensions close to those of the final product, to minimize final part density gradients and machining losses. In order to ensure 100% machining clean-up on all part surfaces, special consideration is given to placement of spacers and spacer blocks on the parts' wear surfaces. Spacer blocks are small structures of similar material to the spacers and are used to help support the positioning of the porous structures. Spacers and spacer blocks are designed near optimum dimensions, enough to prevent part warping, to minimize surface coverage, and to prevent low density regions in the porous structure directly below the spacer. To minimize the adverse effect of spacer indentation into the wear faces, spacer dimensions are such that the planned ID and OD surface machining of the part would remove most of these spacer contact areas.

The various components of fixtures are preferably formed from graphite, but any suitable high temperature resistant material may be used in the practice of the invention. In one embodiment, the spacers and spacer blocks are made from a flexible, compressible graphite-like foil material known as Grafoil®. The Grafoil® material prevents the spacers and spacer blocks from CVI/CVD bonding to the part wear surfaces (and therefore causing these areas of the part to be peeled off upon spacer removal) and minimize indentation as well. The Grafoil® spacers and spacer blocks are easily separated from the parts upon load break-down, leaving the part surfaces intact. Grafoil® spacers are available from GrafTech International, Ltd. of Wilmington, Del.

EXAMPLE 1

A fibrous textile structure was manufactured according to FIGS. 1 through 4 of U.S. Pat. No. 4,790,052 starting with a 320K tow of unidirectional polyacrylonitrile fiber. An annular porous structure was then cut from the textile structure. The annular porous structure was then pyrolyzed to transform the fibers to carbon. Two different types of annular porous structures were used in this example. The first type, Sample A, had approximately 27% fiber volume and a bulk density of approximately 0.46 $g/cm^3$. The second type, Sample B, had approximately 20% fiber volume and a bulk density of about 0.35-0.4 $g/cm^3$. Both Sample A and Sample B annular porous structures were then placed in a furnace similar to furnace 10 of FIG. 3.

Fifty-five of the porous structures were placed into stacks. 0.25 inch thick Grafoil® spacers were located between each porous structure in the stack to create gaps. At the start of the run, the vessel pressure was 11.0 mm Hga and the part temperature was about 1875° F. The average gas residence time in the stack during the run was in the range of about 0.16 seconds, taking into account the 20% gas by-passed to the outside of the stack via radial holes in the base plate, and using the void volume inside the stack. 700 hours-on gas were used in this run.

In addition to stack hardware, CVI/CVD process parameters are important factors for a successful non-pressure gradient single cycle to final density process. Gas flow was maintained at 1.1 F*/minute. 1.1 F*/minute is obtained by dividing the gas flow in standard cubic ft/minute by the volume of the porous structures. During the run, gas mixtures started at about 13.5% and ending at about 8% reactant gases in natural gas, average part temperatures started at about 1875° F. and ended at about 1845° F., and vessel pressures started at about 11.0 mm Hga and ended at about 9.5 mm Hga. The process parameters (gas mixtures, temperature and pressure) were decreased stepwise during the run.

An intermediate carbon heat treatment at 1850° C. was included in this run. The process was run until the density of the porous structures was about 1.75 to 1.8 g/cc.

For the top third of the stack, Archimedes density/porosity revealed desirable densification of the porous structures, in the form of 1.77-1.80 g/cc bulk density with 7-10% open porosity, and an impervious density of 1.93-1.97 g/cc. The deposition was primarily all rough laminar.

This stack hardware design coupled with these process parameters, effectively densified parts to or near final desired density in a non-pressure gradient CVI/CVD run. The results indicated that by increasing the gas residence time, the desired density could be achieved throughout the full height of the stack of parts. The final product had similar properties to the products produced by existing multi-cycle processes.

EXAMPLE 2

The porous structures were placed into stacks. 0.25 inch thick spacers were located between each part in the stack to create a space between the parts and to minimize part warpage. There were 55 parts in the stack. At the start of the run, the initial vessel pressure was set at 20 mm Hga, and the average part temperature in the stack was 1860° F. The average gas residence time in the stack was in the range of about 0.29 seconds, taking into account the 20% gas by-passed to the outside of the stack through the use of radial holes in the base plate, and using the void volume inside the stack. 700 hours on gas were used in this run.

In addition to stack hardware, CIV/CVD process parameters are important factors for a successful non-pressure gradient single cycle to final density process. Gas flow was maintained at 1.15 F*/minute. During the run, the gas mixture was decreased from about 12 to about 8.0% reactant gases in natural gas, average part temperature was decreased from about 1865° F. to about 1835° F., and vessel pressure was decreased from about 20 mm Hga to about 18 mm Hga.

An intermediate carbon heat treatment at 1850° C. was included in this run in a separate furnace when the initial density of the parts reached a density of about 1.5 g/cc after about 300 hours on gas. The parts were pulled out of the initial furnace due to limitations in that furnace which prevented the running of a carbon heat treatment. The parts were placed into another furnace for the carbon heat treatment, without being disturbed or machined. Upon completion of the heat treatment, the parts were moved back to the initial furnace without being disturbed, and the process was then continued until the parts reached the density of about 1.75 to about 1.80 g/cc.

For the upper four-fifths of the stack, the parts were predominantly a rough laminar carbon with an acceptable amount of smooth laminar carbon on the outer surface. (The smooth laminar was removed upon completion of the final part machining.) Archimedes density/porosity revealed desirable densification of the porous structures, in the form of 1.75-1.80 g/cc bulk density with 3 to 8% open porosity, and an impervious density of 1.80-1.93 g/cc.

This stack hardware design coupled with these process parameters, effectively densified parts to or near final desired density in only a non-pressure gradient CVI/CVD run.

After final machining, the Sample A parts had a heat sink average density of 1.774 g/cc and the Sample B parts had a heat sink average density of 1.760 g/cc.

Wear tests and dynamometer tests were performed on these parts. Both Sample A and Sample B parts had similar results to products made from existing multi-cycle CVI/CVD processes.

The aforementioned stack hardware design coupled with these process parameters, effectively densified parts to or near final density. This experiment showed that by increasing the residence time via higher vessel pressures, the desired density could be achieved throughout the full stack height.

EXAMPLE 3

The Sample A porous structures were placed into a stack. 0.25 inch thick spacers were placed between the porous structures. 55 parts were in the stack. At the start of the run, the initial vessel pressure was set at 20 mm Hga and the average part temperature in the stack was 1860° F. The average gas residence time in the stack was in the range of about 0.26 seconds, taking into account the 20% gas by-passed to the outside of the stack through the use of radial holes in the base plate, and using the void volume inside the stack. 600 hours on gas were used in this run.

In addition to stack hardware, CVI/CVD process parameters are important factors for a successful non-pressure gradient single cycle to final density process. Gas flow was maintained at 1.1 F*/minute. During the run the gas mixture was decreased from about 13.5 to about 8.0% reactant gases in natural gas, average part temperature was decreased from about 1875° F. to about 1840° F., and vessel pressure was decreased from about 20 mm Hga to about 14 mm Hga. The decrease in the average part temperature also results in a decrease in the furnace temperature as well as a decrease in the reactant gas temperature. An intermediate carbon heat treatment at 1600° C. was included in this run in the same furnace. The CVI/CVD process was then continued until the parts reached the density of about 1.75 to about 1.80 g/cc.

For the entire stack, the parts were predominantly a rough laminar carbon microstructure with a minimal smooth laminar penetration on the external surfaces. Archimedes density/porosity revealed desirable densification of the porous structures, in the form of 1.73-1.78 g/cc bulk density with 5 to 10% open porosity, and an impervious density of 1.87-1.95 g/cc. The final machined densities on parts in the upper 4/5th of the stack averaged approximately 1.75 g/cc.

This stack hardware design coupled with these process parameters, effectively densified parts to or near final density in only one uninterrupted non-pressure gradient CVI/CVD run.

EXAMPLE 4

The Sample A porous structures were placed into stacks. These structures were about half the volume of the Sample A porous structures used in Examples 1-3. 0.25 inch thick spacers were located at the bottom of the stack between the first porous structure and the base plate, in order to by-pass 15% of the gas to the outside of the stack. ⅛th inch thick spacers were located between each porous structure in the stack. The average gas residence time in the stack was in the range of about 0.10 seconds, taking into account the 15% gas by-passed to the outside of the stack, and using the void volume inside the stack. 750 hours on gas were used in this run.

In addition to stack hardware, CVI/CVD process parameters are important factors for a successful non-pressure gradient single cycle to final density process. Gas flow was maintained at 1.1 F*/minute, with a gas mixture of 6.5% reactant gases in natural gas and vessel pressure of 17 mm Hga. During the run, the average part temperature was decreased from about 1900° F. to about 1840° F. An intermediate carbon heat treatment at 1850° C. was included in this run in the same furnace. The CVI/CVD,process was then continued until the parts reached the density of about 1.79 g/cc.

The parts had a rough laminar carbon microstructure with smooth laminar on the external surfaces. (The smooth laminar was removed upon completion of the final part machining.) The parts had a final average density of the heat sink of 1.79 g/cc. Dynometer test results of the heat sinks demonstrated normal and rejected take-off energies comparable to conventional heat sinks formed by a multi-step process. Density gradients were fairly comparable to those of multi-cycle processed parts.

EXAMPLE 5

The Sample A porous structures were placed into stacks. 0.25 inch thick spacers were located at the bottom of the stack between the first part and the base plate to enable 15% gas by-pass to the outside of the stack. ⅛th inch thick spacers were located between each porous structure in the stack. The average gas residence time in the stack was in the range of about 0.10 seconds, taking into account the 15% gas by-passed to the outside of the stack, and using the void volume inside the stack. 590 hours on gas were used in this run.

In addition to stack hardware, CVI/CVD process parameters are important factors for a successful non-pressure gradient single cycle to final density process. Gas flow was maintained at 1.5F*/minute, with a gas mixture of 6.5% reactant gases in natural gas, average part temperature of 1870° F., and vessel pressures of 23 mm Hga. An intermediate carbon heat treatment at 1850° C. was included in this run in the same furnace. The CVI/CVD process was then continued until the parts reached the density of about 1.77 to about 1.81 g/cc.

The parts had a predominate rough laminar carbon microstructure. The results from this run indicated that the higher vessel pressure of this process reduced the processing time to obtain the desired density.

The embodiments described above and shown herein are illustrative and not restrictive. The scope of the invention is indicated by the claims rather than by the foregoing description and attached drawings. The invention may be embodied in other specific forms without departing from the spirit of the invention. Accordingly, these and any other changes which come within the scope of the claims are intended to be embraced therein.

What is claimed is:

1. A process comprising:

disposing a stack in a furnace, wherein the stack comprises a preform porous structure, wherein the stack has a center open region extending through the stack and an outer region extending outside the stack, around the outside of the preform porous structure, wherein the center open region and outer region is in fluid communication via a channel; and performing a one-cycle, non-pressure gradient process comprising:

heating the porous structure to an initial temperature;

directing a first portion of a reactant gas mixture into the center open region of the stack;

directing a second portion of the gas mixture into the outer region of the stack; and densifying the porous structure in the one cycle to achieve a desired product density, by decreasing at least one of the temperature, the percentage of reactant gas, or the pressure during the one cycle, wherein the porous structure is densified from an average density of less than about 0.60 g/cm$^3$ to an average density of greater than about 1.70 g/cm$^3$ in the one cycle.

2. The process of claim 1 wherein the porosity of the porous structure after densification is less than 15%.

3. The process of claim 1 wherein the porous structure is densified at a pressure in the range of about 5 mm to about 30 mm Hga.

4. The method according to claim 1, wherein the densifying of the preform porous structure to the desired product density in the one cycle is characterized by an absence of in-process machining of the porous structures.

5. The process of claim 1, further comprising decreasing said initial temperature from about 1,875 degrees F. to 1,835 degrees F., and maintaining said vessel pressure between about 10 mm Hga and 25 mm Hga, for about 300 to about 750 hours.

6. The process of claim 1, wherein said reactant gas is a mixture of hydrocarbon gases with between about 80% to about 100% natural gas and between about 20% to about 0% propane.

7. The process of claim 1, wherein said first portion is between about 60% to about 80% of said reactant gas and said second portion is between about 40% to about 20% of said reactant gas.

8. The process of claim 1, wherein said first portion is between about 15% to about 35% of said reactant gas and said second portion is between about 85% to about 65% of said reactant gas.

9. A process comprising:

disposing a stack of porous structures between a bottom plate and a top plate in a furnace, wherein the stack comprises at least a pair of adjacent preform porous structures, wherein the stack has a central aperture and spacers between the pair of adjacent porous structures;

performing a one-cycle, non-pressure gradient process comprising:

heating the pair of adjacent preform porous structures to an initial temperature;

introducing a reactant gas mixture containing an initial percentage of reactant gas to produce an initial pressure in the range of about 5 mm Hga to about 30 mm Hga into the center aperture and area outside the stack; and densifying the pair of adjacent preform porous structures in the one cycle to achieve a desired product density by decreasing at least one of the temperature, the percentage of reactant gas, or the pressure during the one cycle, wherein the porous structures are densified from an average density of less than about 0.60 g/cm$^3$ to an average density of greater than about 1.70 g/cc in the one cycle.

10. The method according to claim 9, further comprising spacing one of said pair of porous structures at one end of said stack away from a blocking plate thereby forming an open passage therebetween and passing at least some of said reactant gas from said center aperture to said area outside the stack.

11. The process of claim 9, further comprising decreasing said temperature from about 1,875 degrees F. to 1,835 degrees F., and maintaining said vessel pressure between about 10 mm Hga and about 25 mm Hga, for about 300 to about 750 hours.

12. The process of claim 9, wherein said reactant gas is a mixture of hydrocarbon gases with between about 80% to about 100% natural gas and between about 20% to about 0% propane.

13. The process of claim 9, wherein a first portion of the reactant gas mixture is directed into the center aperture and is between about 60% to about 80% of said reactant gas and a second portion of the reactant gas mixture is directed into the area outside the stack and is between about 40% to about 20% of said reactant gas.

14. The process of claim 9, wherein a first portion of the reactant gas mixture is directed into the center aperture and is between about 15% to about 35% of said reactant gas and a second portion of the reactant gas mixture is directed into the area outside the stack and is between about 85% to about 65% of said reactant gas.

15. A process comprising:

disposing a stack in a furnace, wherein the stack comprises a preform porous structure, wherein the stack has a center open region extending through the stack and an outer region extending outside the stack, around the outside of the preform porous structure, wherein the center open region and outer region is in fluid communication via a channel; and performing a one-cycle, non-pressure gradient process comprising:

heating the porous structure to an initial temperature;

directing a first portion of a reactant gas mixture into the center open region of the stack;

directing a second portion of the gas mixture into the outer region of the stack; and densifying the porous structure in the one cycle to achieve a desired product density, by decreasing at least one of the temperature, the percentage of reactant gas, or the pressure during the one cycle, wherein the porosity of the porous structure after densification in the one cycle is less than about 15%.

16. The process of claim 15, wherein the porous structure is densified at a pressure in the range of about 5 mm Hga to about 30 mm Hga.

17. The process of claim 15, further comprising decreasing said temperature from about 1,875 degrees F. to 1,835 degrees F., and maintaining said vessel pressure between about 10 mm Hga and about 25 mm Hga, for about 300 to about 750 hours.

18. The process of claim 15, wherein said reactant gas is a mixture of hydrocarbon gases with between about 80% to about 100% natural gas and between about 20% to about 0% propane.

19. The process of claim 15, wherein said first portion is between about 60% to about 80% of said reactant gas and said second portion is between about 40% to about 20% of said reactant gas.

20. The process of claim 15, wherein said first portion is between about 15% to about 35% of said reactant gas and said second portion is between about 85% to about 65% of said reactant gas.

* * * * *

UNITED STATES PATENT AND TRADEMARK OFFICE

CERTIFICATE OF CORRECTION

PATENT NO. : 7,691,443 B2
APPLICATION NO. : 11/141499
DATED : April 6, 2010
INVENTOR(S) : James W. Rudolph and Vincent Fry It is certified that error appears in the above-identified patent and that said Letters Patent is hereby corrected as shown below:

Column 14, line 64, “degrees F to 1,835 degrees F” should read --degrees F to about 1,835 degrees F--.

Signed and Sealed this
Twenty-second Day of March, 2011

David J. Kappos
*Director of the United States Patent and Trademark Office*